United States Patent [19]

Hanley

[11] Patent Number: 5,471,140

[45] Date of Patent: Nov. 28, 1995

[54] MAGNETIC FIELD GENERATING ASSEMBLY

[75] Inventor: Peter Hanley, Gloucestershire, Great Britain

[73] Assignee: Oxford Instruments Limited, Oxford, Great Britain

[21] Appl. No.: 343,880

[22] Filed: Nov. 17, 1994

Related U.S. Application Data

[63] Continuation of Ser. No. 39,049, Apr. 12, 1993, abandoned.

[30] Foreign Application Priority Data

Oct. 11, 1990 [GB] United Kingdom .................. 9022145
Oct. 10, 1991 [WO] WIPO: ..................... PCT/GB91/10798

[51] Int. Cl.$^6$ .................................................. G01R 33/20
[52] U.S. Cl. ............................................ 324/303; 324/318
[58] Field of Search .................................... 324/303, 300, 324/318; 335/229; 128/653.5

[56] References Cited

U.S. PATENT DOCUMENTS

| | | | |
|---|---|---|---|
| 4,350,955 | 9/1982 | Jackson et al. | 324/303 |
| 4,714,881 | 12/1987 | Givens | 324/303 |
| 4,717,876 | 1/1988 | Masi et al. | 324/303 |

FOREIGN PATENT DOCUMENTS

| | | |
|---|---|---|
| 20154996 | 9/1985 | European Pat. Off. . |
| 20295134 | 12/1988 | European Pat. Off. . |
| 241235 | 12/1984 | United Kingdom . |
| 86/04687 | 8/1986 | WIPO . |

*Primary Examiner*—Sandra L. O'Shea
*Assistant Examiner*—Raymond Y. Mah

[57] ABSTRACT

An assembly which generates a magnetic field in a working volume spaced from the assembly. The assembly includes first and second magnets, each having a north and a south pole and a respective magnet axis which joins the north and south poles, the first and second magnets being positioned so that the respective magnet axes are along a main axis of the assembly and a pole of the first magnet faces a like pole of the second magnet. Third and fourth magnets, each having a north and a south pole and a respective magnet axis which joins the north and south poles, are positioned so that the respective magnet axes are substantially parallel with the main axis, wherein the position of at least one magnet of the group including the first, second, third and fourth magnets is adjustable in the direction of the main axis and the relative positions and field strengths of the first, second, third and fourth magnets are chosen to control the radial dimension and the characteristics of the magnetic field generated in the working volume.

29 Claims, 3 Drawing Sheets

MAGNETIC FIELD GENERATING ASSEMBLY

This application is a continuation, of application Ser. No. 08/039,049, filed Apr. 12, 1993, now abandoned.

BACKGROUND OF THE INVENTION

1. Field of the Invention

The invention relates to a magnetic field generating assembly for use in nuclear magnetic resonance (NMR) apparatus and, in a particular, to such apparatus for use in well-logging applications.

2. Description of the Related Art

It is well known that NMR can be used to inspect the geology around a bore hole. This is achieved by projecting a substantially uniform magnetic field into the rock surrounding the bore hole using a suitable field generator and then performing an NMR experiment within the projected region. Commercial well-logging tools make use of the Earth's magnetic field but this is not a satisfactory technique and is particularly unsuitable for inspecting the so-called "uninvaded zone" surrounding the bore hole. The uninvaded zone is that zone where there is no drilling fluid.

EP-A-0295134 describes apparatus and methods which seek to improve upon the earlier methods using the Earth's magnetic field. In this apparatus, four magnets are provided positioned with their north-south directions lying on a common axis and with the north-south directions of the outer magnets and inner magnets respectively being opposed. The magnets are fixed to one another for ease of movement along a bore hole. The electrical coil required to generate an rf magnetic field so as to perform the NMR experiment is mounted around the magnets.

This known arrangement suffers from a number of problems. Since there is magnetic material in the center of the apparatus, this reduces the field strength in the working volume projected outside the apparatus. Furthermore, positioning the rf coil around the magnets forces the designer to choose a non-conducting magnet material to avoid effects due to eddy-currents and noise coupling. This limits the magnet materials in practice to permanent magnet materials, such as ferrites, and so prevents the use of materials now available with up to three times the strength which would enable measurements to be made at greater distances into the rock. In addition, it is not feasible for producing large sensitive volumes because no provision is made for adjusting errors due to non-uniformities in the materials used and other differences between the as manufactured and designed arrangement.

An earlier approach is described in U.S. Pat. No. 4,350,955. In this case, just two magnets are provided spaced apart with their north-south axes aligned and with like poles facing one another. This arrangement has the advantage that the rf coil can be positioned in the space between the magnets with the consequence that the magnets themselves can be made of non-permanent materials. However, the placement of the magnets is intrinsically less efficient than in EP-A-0295134. Although the arrangement of U.S. Pat. No. 4,350,955 offers good vertical resolution (typically a few centimeters) it is not possible to change the radius of the working region in any convenient way. The ability to make measurements at several different distances into the rock is generally a requirement. Further, it has been reported that the apparatus of U.S. Pat. No. 4,350,955 can take 18 hours to measure one point. This is completely unacceptable in a practical well-logging situation.

SUMMARY OF THE INVENTION

In accordance with one aspect of the present invention, a magnetic field generating assembly for use in an NMR apparatus comprises a pair of first magnets, lines joining the north-south poles of the magnets being positioned along an axis with like poles facing one another; and at least one pair of second magnets positioned with lines joining their north-south poles substantially parallel with the axis, wherein the positions and field strengths of the magnets are chosen so that a resultant field of controlled characteristics suitable for an NMR experiment is generated in a working volume spaced from the assembly and is characterised in that the magnets are relatively adjustable in the axial direction.

We have devised a very significant improvement on the apparatus shown in EP-A-0295134. One major limitation of that earlier approach is that the relative positions of the magnets are fixed. By permitting the magnets to be adjustable it is possible to achieve a significant increase in field strength in the working volume and to increase the size of the volume which is subjected to a particular field strength. The method of the present invention results in improved homogeneity of the toroidal zone with greater flexibility. In a further refinement, it is also possible to obtain several different working volumes simultaneously.

This is achieved by using the second magnets to balance all or some of the non-zero order components of the fields generated by the first magnets in the working volume(s). The radial field uniform zone around the circumference of the toroidal zone of interest can be controlled by the addition of a single pair of magnets. Further pairs of magnets can be added to control a series of increasing orders of derivatives of field with radial distance. The contiguous pole faces of the prior art have a strong demagnetising effect on each other making control of a long series of orders difficult. In one application, substantially all of the non-zero order components are balanced so that the field in the working volume(s) is substantially uniform. However, in one important application, it is possible to design the assembly so that at least the first order and possibly other orders are not cancelled or significantly reduced so that a gradient field of known characteristics is generated in the working volume. It is well known that a gradient magnetic field enables spatial resolution to be achieved within the working volume when performing NMR experiments.

A further advantage of the assembly is that the magnets can be arranged such that there is a space at the center of the assembly into which an rf coil can be positioned. This enables at least the axially outer magnets to be constructed from non-insulating material. RF transmit/receive coils can be air cored and therefore made of a wider choice of materials without coupling to the receiver coil and inducing noise into the receiver system or damping the transmitter circuit.

Typically, the second magnets will be positioned axially inwardly with respect to the first magnets. Further, there may be more than two first or second magnets.

In general, the inner magnets, usually the second magnets, will be permanent magnets, usually made of ferrite material, while the axially outer magnets, usually the first magnets, can be permanent magnets, resistive electromagnets or superconducting magnets.

Typically, the assembly will be symmetrical about a mid-plane orthogonal to the axis, although this may not always be the case.

Typically, the assembly further comprises a support to which the magnets are adjustably mounted. For example, each magnet could be connected to the support by a bracket which can be bolted to the support in a variety of positions. In another example, the magnets could be mounted to a common lead screw via suitable connectors, rotation of those connectors causing the magnets to move longitudinally parallel with the lead screw.

As has already been mentioned, the invention is particularly applicable to an NMR apparatus which comprises a magnetic field generating assembly according to the first aspect of the invention, and an electrical coil for generating an rf magnetic field positioned at the center of the assembly.

The invention also provides well-logging apparatus comprising a magnetic field generating assembly according to the first aspect of the invention, the assembly being shaped so as to be movable along a bore hole, and an electrical coil for generating an rf magnetic field positioned at the centre of the assembly.

In accordance with a second aspect of the present invention, a method of constructing a magnetic field generating assembly for use in NMR apparatus comprises positioning a pair of first magnets with the lines joining their north-south poles lying along an axis with like poles facing one another; positioning at least one pair of second magnets with lines joining their north-south poles substantially parallel with the axis; determining the field profile in a working volume spaced from the assembly due to the first magnets; and selecting the field strengths and positions of the second magnets so that a resultant field of controlled characteristics suitable for an NMR experiment is generated in the working volume.

BRIEF DESCRIPTION OF THE DRAWINGS

An example of well-logging apparatus according to the invention will now be described with reference to the accompanying drawings, in which.

DESCRIPTION OF THE PREFERRED EMBODIMENTS

Figure 1:
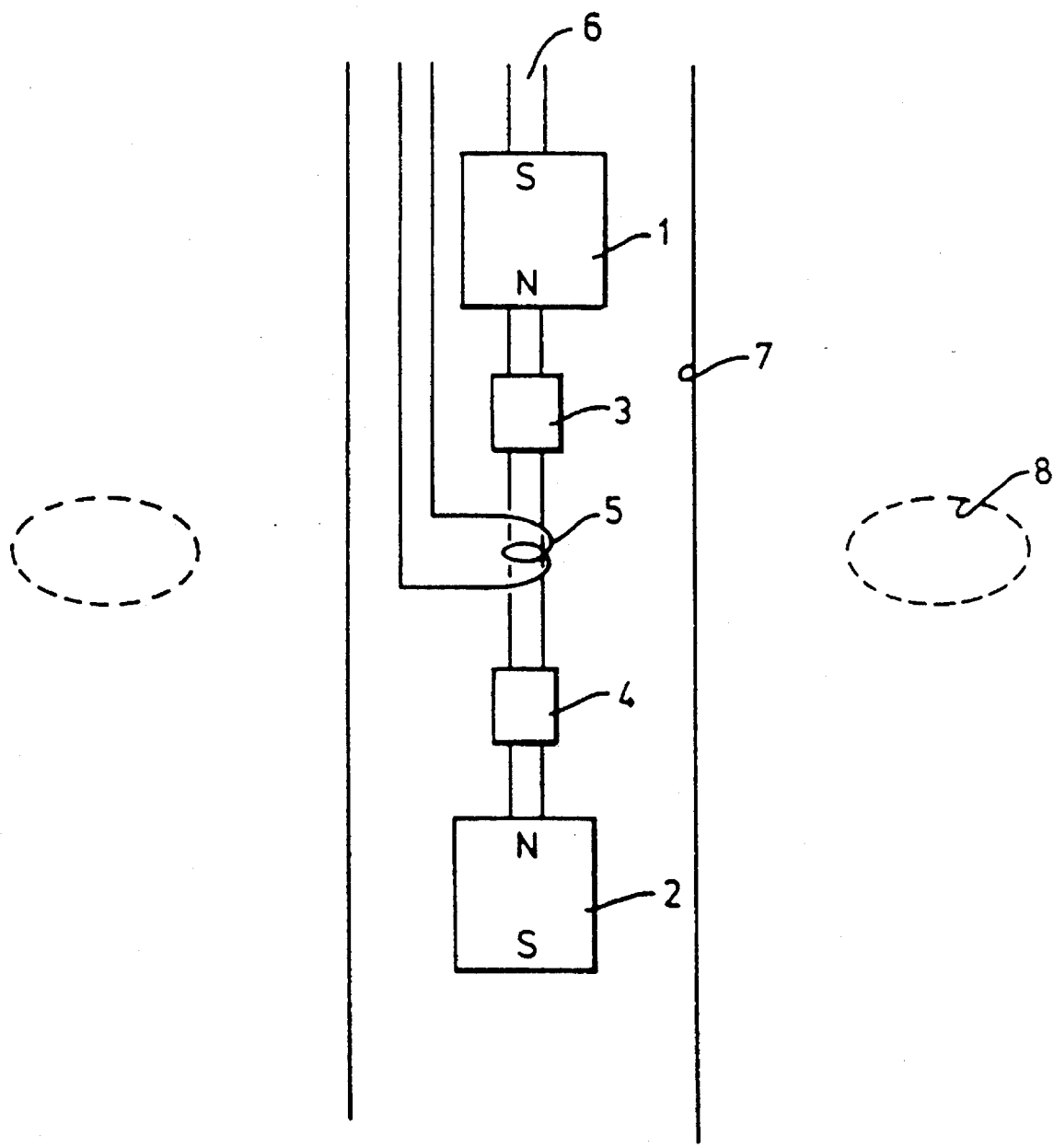
FIG. 1 is a schematic view of the apparatus.

The apparatus shown in FIG. 1 comprises a pair of main, first magnets 1,2 positioned coaxially with their north poles facing one another. The magnets 1,2 are mounted by means not shown to a support 6. Axially inwardly of the magnets 1,2 are mounted a pair of second, auxiliary magnets 3,4 with their north-south axes coaxial with the axis defined by the magnets 1,2. The direction and magnetization strength of the magnets 3,4 is selected from a knowledge of how the different gradients vary. The magnets 1–4 are generally symmetrically positioned about a mid-plane orthogonal to the axis and an rf coil 5 is positioned between the magnets 3,4 at the mid-plane. The coil 5 is used during an NMR experiment in a conventional manner firstly to generate an rf magnetic field and then to act as a receiver to monitor rf signals generated by the precessing nuclei as they relax back to their original state. The coil 5 is connected to conventional NMR processing electronics (not shown) while the support 6 is connected to a mechanism (not shown) which drops the assembly down through a bore hole 7. As will be explained in more detail below, the magnets 1–4 are positioned and have field strengths such that a toroidal working volume 8 is generated within the rock strata surrounding the bore hole 7, the magnetic field within the working volume 8 being sufficiently uniform to perform an NMR experiment. In some examples, additional working volumes could be generated radially spaced apart.

Figure 2A:
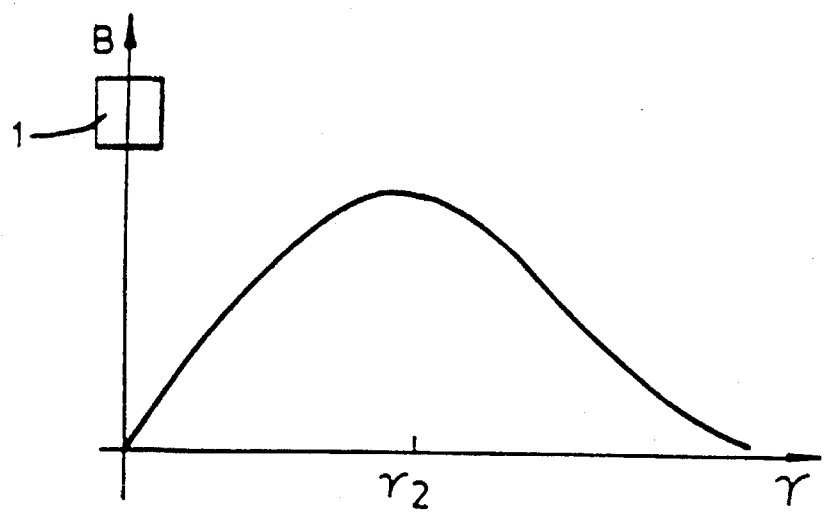
FIGS. 2a–2c illustrate graphically the variation of magnetic field strength with radius for separate magnets and the combined magnet system in FIG. 1, respectively; and, FIG. 3 illustrates graphically the variation in magnetic field strength for generating two working volumes of substantially uniform field, and the generation of a gradient magnetic field within a working volume.
Figure 2B:
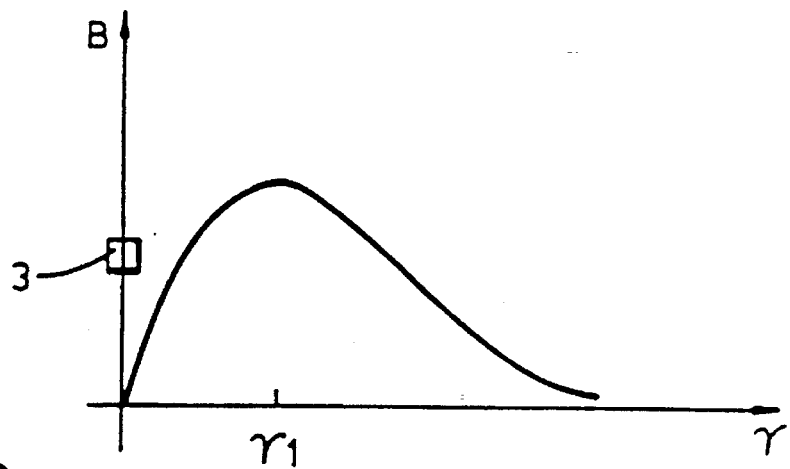
Figure 2C:
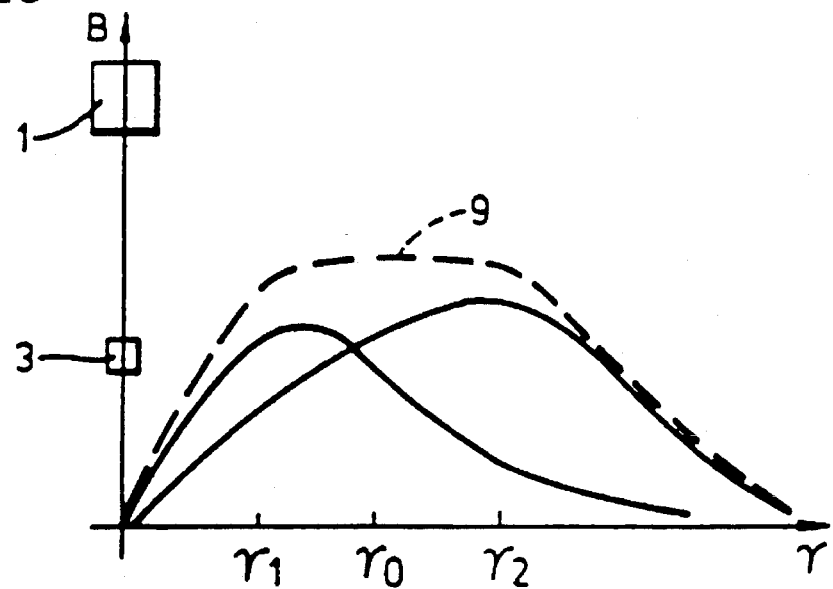

The radial field profile generated by the magnet i is shown schematically in FIG. 2a and that produced by the magnet 3 is shown in FIG. 2b. FIG. 2a shows that the main, powerful magnet 1 produces a peak field at a relatively large radius $r_z$ and FIG. 2b shows the weaker magnet 3 producing a peak at a smaller radius $r_1$. FIG. 2c shows the sum of these components where the relative strength and positions of the two pairs of magnets are such that a uniform region of field 9 has been produced centered about a radius $r_0$.

To design such a system, it is convenient to express the magnetic field B at $r_0$ as a Taylor expansion:

$$B(r-r_0) = B(r_0) + \frac{dB}{dr}\bigg|_{r_0}(r-r_0) + \frac{d^2B}{dB^2}\bigg|_{r_0}\frac{(r-r_0)}{2!}^2 + \text{etc}$$

To achieve the region of uniformity, we choose the magnets such that the individual gradients, $$\frac{d^nB}{dr^n}$$

sum to zero for the assembly of magnets. It should be noted that the technique is not restricted to two pairs of magnets: for more complex systems we have sufficient degrees of freedom to cancel higher order gradients thereby resulting in a greater volume of uniformity. It should also be noted that if required, we could leave a residual first order gradient, to provide spatial information in the NMR signal, so that in the received signal, the location of the source of signal would be such that $(f-f_0)=g.G.(r-r_0)$ where G is the strength of the first order gradient and g is the gyro magnetic ratio for the nuclei being detected. This technique is familiar to those skilled in magnetic resonance imaging or zeugmatography. Such a first order gradient could also be used to measure diffusion effects by techniques that are well known in NMR spectroscopy.

In the description that follows, the discussion is appropriate to uniformly magnetised permanent magnets. Similar descriptions can be obtained for air-cored coils etc., and non-uniform magnetisation can be modelled using a superposition of several magnets of differing magnetisation.

We begin by calculating the field due to a thin magnetised bar. This simplifies the mathematical discussion but it can be readily extended to a general form.

$$\phi = \frac{1}{4\pi\mu} \int M \cdot \nabla\left(\frac{1}{s}\right) dV$$

volume of magnetised material volume of magnetised material

We define a field point $\bar{p}=(x,y,z)$ and a source point $\bar{q}=(u,v,w)$. Then $\bar{s}=\bar{p}-\bar{q}=(x-u, y-v, z-w)$.

Let the magnetization be in the z-direction so M=(O,O, M).

$$\phi = \frac{-M}{4\pi\mu} \int \frac{\partial}{\partial w} \left( \frac{1}{s} \right) dV$$

$$\phi = \frac{-AM}{4\pi\mu} \int \frac{(z-w)dw}{s^3}$$

Let the magnetic material be confined to a thin bar of cross-sectional area A, lying along the z-direction so $\bar{q} = (O, O, w)$.

The field is then given by $$\bar{H} = -\nabla_p \phi$$
$$\bar{B} = \mu \bar{H}$$

$$\bar{B} = \frac{AM}{4\pi} \nabla \left. \frac{1}{(x^2+y^2+(z-w)^2)^{1/2}} \right|_{w_1}^{w_2}$$

In cylindrical polar coordinates:

$$\bar{B} = \frac{AM}{4\pi} \nabla \left. \frac{1}{(r^2+(z-w)^2)^{1/2}} \right|_{w_1}^{w_2}$$

from which $$B_z = \frac{AM}{4\pi} \left. \frac{z-w}{(r^2+(z-w)^2)^{3/2}} \right|_{w_1}^{w_2}$$

$$B_r = \frac{AM}{4\pi} \left. \frac{r}{(r^2+(z-w)^2)^{3/2}} \right|_{w_1}^{w_2}$$

In our system of opposed magnets, symmetric about the z= 0 plane, the $H_z$s cancel and the $H_r$s reinforce, hence $$B = B_r = \frac{AM}{2\pi} \left. \frac{r}{(r^2+w^2)^{3/2}} \right|_{w_1}^{w_2}$$

$$\frac{dB_r}{dr} = \frac{AM}{2\pi} \left. \frac{w^2-2r^2}{(r^2+w^2)^{5/2}} \right|_{w_1}^{w_2}$$

-continued $$\frac{d^2B_r}{dr^2} = \frac{AM}{2\pi} \left. \frac{r(6r^2-9w^2)}{(r^2+w^2)^{7/2}} \right|_{w_1}^{w_2}$$

etc.

The above description is only accurate for thin magnets, whose radii are much less than the radial position of the field point at which the magnetic field is measured. An exact representation which however requires rather more computational effort is provided by the current sheet model.

Text books on electromagnetism show that a uniformly magnetised solid can be replaced by a closed sheet over its surface carrying a current density whose direction is perpendicular to that of the magnetisation. This representation is exact (so long as the magnetisation is uniform and unidirectional) and straightforward to deal with in the case of axially magnetised cylindrical objects. In this case, the external field is that of a solenoid of zero thickness. Expressions (and computer code) for this exist and generally require integrating the field due to an elementary hoop with respect to length, polar angle and radial thickness. In the case of a current sheet we may omit integration with respect to radius so that:

$$B_r = \frac{M}{4\pi} \left| \int_0^{2\pi} \frac{a\cos(\phi)d\phi}{((z-b)^2+r^2+a^2-2ar\cos(\phi))^{1/2}} \right|_{w_1}^{w_2}$$

$$B_z = \frac{M}{4\pi} \left| \int_0^{2\pi} a(z-w) \frac{(a-r\cos(\phi)d\phi}{(r^2+a^2-2ar\cos(\phi))((z-w)^2+r^2+a^2-2ar\cos(\phi))^{1/2}} \right|_{w_1}^{w_2}$$

Where we have also replaced the solenoidal current density, j/10 (j in Amperes/cm$^2$) with the magnetisation M/4$\pi$ (M in gauss per cm$^3$), the dimensions becoming correct from the absence of the integration over "a".

The $\phi$ integral is done by substituting $\theta = \phi/2$ and using the numerical evaluation of the elliptic integral $$CEL(K_c,p,a,b) =$$

$$\int_0^{\pi/2} \frac{(a\cos^2(\theta)+b\sin^2(\theta))d\theta}{(\cos^2(\theta)+p\sin^2(\theta))(\cos^2(\theta)+k_c^2\sin^2(\theta))^{1/2}}$$

(Bulirsch, Numerical Math, vol 9, 305 (1969) Using this method, the radial field derivatives may be obtained by numerical differentiation.

EXAMPLE

A magnet system to produce a field peak of 50 gauss at a radial distance of 40 cm has w1= 56 cm, w2= 206 cm and MA= 2.5 10$^6$ gauss-cm$^2$. This could be made from Nd-Fe-B alloy, 16 cm in diameter and with a magnetisation of 12500 gauss. This produces a sensitive region whose radial extent (uniform to 1 in 10$^3$) is about 2 cm.

Below are tabulated the gradient functions for unit value of AM at 30 cm radius. In the same table are included the gradient functions for a magnet with w1= 10.3 cm and w2= 11.3 cm. It should be noted that the ratio of dB/dr to d$^2$B/dr$^2$ are the same for the two systems, but the signs of the individual gradients are different.

| $w1 = 56$ | $w2 = 206$ | $\frac{dB}{dr}$ | $d^2B/dr^2$ | $\frac{dB}{dr} / \frac{d^2B}{dr^2}$ |
|---|---|---|---|---|
| r | B | | | |
| $+3.000E+01$ | $+1.137E-04$ | $+1.187E-06$ | $-1.633E-07$ | $-7.270E+00$ |

| $w1 = 10.3$ | $w2 = 11.3$ | | | |
|---|---|---|---|---|
| r | B | $dB/dr$ | $d^2B/dr^2$ | $dB/dr/d^2B/dr^2$ |
| $+3.000E+01$ | $+2.948E-05$ | $-3.367E-06$ | $+4.634E-07$ | $-7.265e+00$ |

By choosing the strength of the smaller magnet to be 0.3525 that of the larger we get cancellation of the first and second order gradients.

| | Element # or 0 | $1.000E+000$ | | |
|---|---|---|---|---|
| | M.A. gauss | $2.500E+006$ | | |
| | $w1$ cm | $5.600E+006$ | | |
| | $w2$ | $2.060E+002$ | | |
| | Element # or 0 | $2.000E+000$ | | |
| | M.A. gauss | $8.813E+005$ | | |
| | Z1 cm | $1.030E+001$ | | |
| | Z2 | $1.130E+001$ | | |
| R | $3.000E+001$ | | | |
| | Br | $dBr/dr$ | $d^3Br/dr^3$ | $d^3Br/dr^3$ |
| | $4.523E+001$ | $4.723E-001$ | $-6.496E-002$ | $2.256E-003$ |
| | $4.135E000$ | $-4.722E-001$ | $6.500E-002$ | $-1.030E-002$ |
| total | $4.937E+001$ | $1.265E-004$ | $3.199E-005$ | $-8.039E-003$ |

$$\frac{d^4Br}{dr^4}$$
$1.166E-004$
$2.497E-003$
$2.614E-003$

Figure 3:
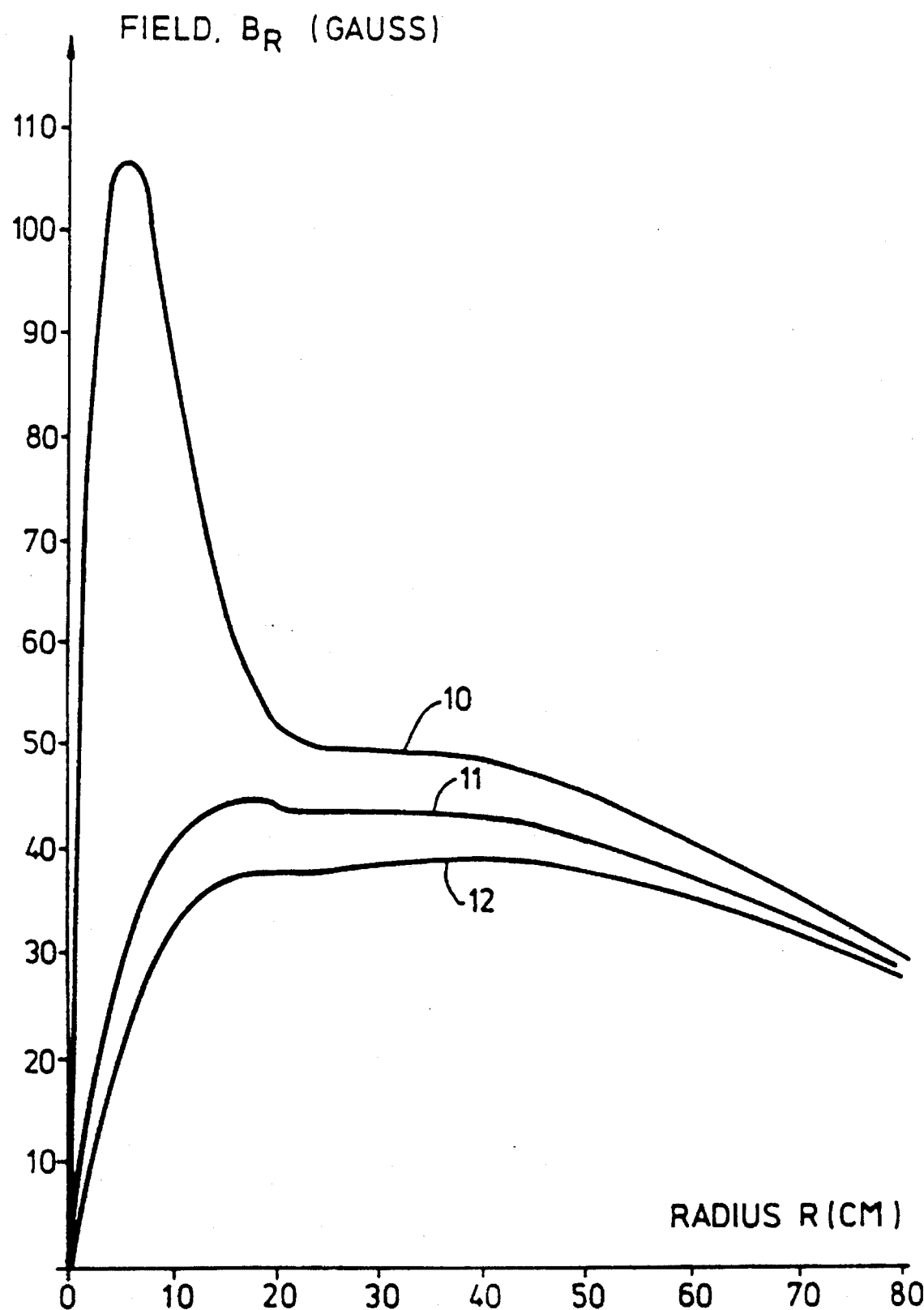

FIG. 3 shows at 10 the magnetic field plotted against radial distance for the combination with two pairs of magnets.

By including more magnets in the system, higher order gradients could be cancelled thereby increasing the volume of uniformity still further. Graph 11 shows the results for three pairs of magnets and graph 12 is that for three pairs with a first order gradient.

Because the smaller magnet is weaker, it can be made of ferrite so that its proximity to the RF coil does not cause any problems with coupling. For example, a 16 cm diameter disc of ferrite with magnetisation 4380 gauss will achieve the desired effect.

To compensate for manufacturing errors, additional discs of ferrite can be added to (or removed from) the small magnet to get the correct ratio of strengths, and axial movements can be made to achieve the correct ratio of gradients.

The magnets 3,4 will typically be made of a permanent magnet material such as ferrite but the magnets 1,2 could be permanent magnets, resistive magnets or superconductive magnets.

When more than two pairs of magnets are included in the system, in order to cancel higher order gradients, it becomes more difficult to balance the ratios of the gradients in the way described above. An alternative method is to seek a minimum in a function such as $$\left| k_1 \left[ H_1 - \sum_j h_1(w_{1j}, w_{2j}, M_j) \right]^2 + k_2 \left[ H_2 - \sum_j h_2(w_{1j}, w_{2j}, M_j) \right]^2 + k_3 \left[ H_3 - \sum_j h_3(w_{1j}, w_{2j}, M_j) \right]^2 + \text{etc} \right|^{1/2}$$

Where the $H_k$ are the gradients of the main magnet to be cancelled and the $h_k(w_{1j}, w_{2j}, M_j)$ are the gradients of the correcting magnets whose ends are at $z = w_1$ and $z = w_2$ and whose strength is M. The constants $K_k$ are weighting factors for each order of gradient. The minimum or minima can be found using computer programs which rely on well-known methods such as "simulated annealing" or "steepest slope".

The gradients due to a system comprising three pairs of magnets found in this way are tabulated below. It should be noted that this has allowed substantial reduction in the 3rd and 4th order gradients compared with the system of two pairs described above. It should also be noted that one pair of magnets is magnetised in opposition to the other two pairs.

| Element # or 0 | $1.000E+000$ |
|---|---|
| M.A. gauss | $2.413E+006$ |
| $w1$ cm | $5.600E+006$ |
| $w2$ | $2.060E+002$ |
| Element # or 0 | $2.000E+000$ |
| M.A. gauss | $4.172E+005$ |
| Z1 cm | $1.950E+001$ |
| Z2 | $2.463E+001$ |

-continued

| | | | | |
|---|---|---|---|---|
| Element # or 0 | 3.000E+000 | | | |
| M.A. gauss | −6.722E+005 | | | |
| Z1 cm | 3.653E+001 | | | |
| Z2 | 4.435E+001 | | | |
| | 3.000E001 | | | |
| R | H0 | dBr/dr | $d^2Br/dr^2$ | $d^3Br/dr^3$ |
| | 4.366E+001 | 4.559E−001 | −6.270E−002 | 2.177E−003 |
| | 9.423E+000 | −7.081E−001 | 5.337E−002 | −2.804E−003 |
| total | −9.479E+000 | 2.516E−001 | 8.935E−003 | −2.466E−003 |
| | 4.360E+001 | −6.310E−004 | −4.003E−004 | −3.093E−003 |

$d^4Br/dr^4$
1.125E−004
2.172E−004
1.981E−004
5.278E−004

FIG. 3 shows at 11 a uniform field generated from three pairs of magnets.

The same procedure can be used to design magnet systems where a gradient is deliberately introduced. This may be done so as to a) provide spatial information from the sensitive region using the well-known techniques of magnetic resonance imaging.

b) optimise the radio-frequency pulse over the complete sensitive region (which now has a large radial extent in these compensated systems) to compensate for the non-uniformity of the field produced by the transmitter coil by providing a pulse or series of pulses whose intensity varies with frequency in such a way as to provide this compensation via the gradient's imposing a relationship between resonant frequency and radius.

For example, a first order gradient can be introduced by subtracting the required gradient from the value of $H_1$ used in the function to be minimised.

A typical result where a first-order gradient of 0.1 gauss per cm. has been deliberately introduced is shown below:

FIG. 3 shows the profiles of field versus radius for the three magnet systems described above. Note that the remanent third order gradient produces a subsidiary maximum at a smaller radius. The relatively uniform field at this maximum can be used as a second sensitive region, and because it is closer to the RF coil than the main region it does not need to be so big to provide adequate signal strength. Because resonance occurs at a different frequency, this can be excited independently and so information can be obtained from two regions simultaneously.

I claim:

1. An assembly which generates a magnetic field in a working volume spaced from the assembly, the assembly for use in NMR apparatus and comprising:

first and second magnets, each having a north and a south pole and a respective magnet axis which joins the north and south poles, the first and second magnets being positioned so that the respective magnet axes are along a main axis of the assembly and a pole of the first magnet faces a like pole of the second magnet; and third and fourth magnets, each having a north and a south

| | | | | |
|---|---|---|---|---|
| Element # or 0 | 1.000E+000 | | | |
| M.A. gauss | 2.413E+006 | | | |
| w1 cm | 5.600E+006 | | | |
| w2 | 2.060E+002 | | | |
| Element # or 0 | 2.000E+000 | | | |
| M.A. gauss | 3.200E+005 | | | |
| Z1 cm | 2.050E+001 | | | |
| Z2 | 2.889E+001 | | | |
| Element # or 0 | 3.000E+000 | | | |
| M.A. gauss | −6.803E+005 | | | |
| Z1 cm | 3.601E+001 | | | |
| Z2 | 5.109E+001 | | | |
| | 3.000E001 | | | |
| R | H0 | dBr/dr | $d^2Br/dr^2$ | $d^3Br/dr^3$ |
| | 4.366E+001 | 4.559E−001 | −6.270E−002 | 2.177E−003 |
| | 1.070E+001 | −7.172E−001 | 4.440E−002 | −9.708E−004 |
| total | −1.593E+001 | 3.611E−001 | 1.806E−002 | −3.842E−003 |
| | 3.843E+001 | 9.980E−002 | −2.394E−004 | −2.636E−003 |

$d^4Br/dr^4$
1.125E−004
−8.788E−005
2.663E−004
2.909E−004 pole and a respective magnet axis which joins the north and south poles, the third and fourth magnets being positioned so that the respective magnet axes are substantially parallel with the main axis, wherein the position of at least one magnet of the group comprising the first, second, third and fourth magnets is adjustable in the direction of the main axis and the relative positions and magnetic field strengths of the first, second, third and fourth magnets are chosen to control the radial dimension and the characteristics of the magnetic field generated in the working volume to form a magnetic field suitable for use in an NMR experiment.

2. An assembly according to claim 1, wherein the magnetic field generated in the working volume has a first order gradient in the radial direction.

3. An assembly according to claim 2, wherein the third and fourth magnets are positioned along the main axis between the first and second magnets.

4. An assembly according to claim 1, wherein the third and fourth magnets are permanent magnets.

5. An assembly according to claim 1, wherein the first and second magnets are both permanent magnets, resistive electromagnets, or superconducting magnets.

6. An assembly according to claim 1, wherein the axial positions along the main axis and magnetic field strengths of the third and fourth magnets are chosen so as to perform at least one of reduce and cancel non-zero order components of magnetic fields generated by the first and second magnets.

7. An assembly according to claim 1, wherein the axial positions along the main axis of the first, second, third and fourth magnets are adjustable and the assembly further comprises a support member to which the first, second, third and fourth magnets are adjustably mounted.

8. An assembly according to claim 1 further comprising at least one electrical coil which generates and detects an rf magnetic field and is positioned along the main axis at a center position in relation to the first, second, third and fourth magnets.

9. An assembly according to claim 8, wherein the first and third magnets are axially spaced to one side of the center position and the second and fourth magnets are axially spaced to the other side of the center position.

10. A method of constructing an assembly which generates a magnetic field in a working volume spaced from the assembly, the method comprising the steps of:

positioning first and second magnets, each having a north and a south pole and a respective magnet axis which joins the north and south poles, so that the respective magnet axes are along a main axis of the assembly and with a pole of the first magnet facing a like pole of the second magnet;

positioning third and fourth magnets, each having a north and a south pole and a respective magnet axis which joins the north and south poles, so that the respective magnet axes are substantially parallel with the main axis;

determining a magnetic field profile in the working volume resulting from the magnetic properties of the first and second magnets; and selecting the magnetic field strengths and adjusting the relative positions of the third and fourth magnets to control the radial dimension and the characteristics of the magnetic field in the working volume.

11. An assembly according to claim 2, wherein the third and fourth magnets are positioned along the main axis between the first and second magnets.

12. An assembly according to claim 2, wherein the third and fourth magnets are both permanent magnets.

13. An assembly according to claim 4, wherein the third and fourth magnets are both permanent magnets.

14. An assembly according to claim 1, wherein the first and second magnets are both permanent magnets, resistive electromagnets, or superconducting magnets.

15. An assembly according to claim 2, wherein the first and second magnets are both permanent magnets, resistive electromagnets, or superconducting magnets.

16. An assembly according to claim 2, wherein the axial positions along the main axis and magnetic field strengths of the third and fourth magnets are chosen so as to perform at least one of reduce and cancel non-zero order components of magnetic fields generated by the first and second magnets.

17. An assembly according to claim 3, wherein the axial positions along the main axis and magnetic field strengths of the third and fourth magnets are chosen so as to perform at least one of reduce and cancel non-zero order components of magnetic fields generated by the first and second magnets.

18. An assembly according to claim 2, wherein the axial positions along the main axis of the first, second, third and fourth magnets are adjustable and the assembly further comprises a support member to which the first, second, third and fourth magnets are adjustably mounted.

19. An assembly as in claim 1, further comprising fifth and sixth magnets each having a north and a south pole and a respective magnet axis which joins the north and south poles, the fifth and sixth magnets positioned along the main axis so that the respective magnet axes are substantially parallel with the main axis.

20. An assembly according to claim 20, wherein the first and second magnets define a first pair of magnets, the third and fourth magnets define a second pair of magnets and the fifth and sixth magnets define a third pair of magnets and one pair of the first pair, second pair and third pair of magnets is magnetized in opposition to the other pairs of magnets.

21. An assembly according to claim 1, wherein the working volume has a radial dimension of more than 10 cm.

22. An assembly according to claim 21, wherein the working volume has a radial dimension of more than 20 cm.

23. An assembly according to claim 1, wherein a radially inner side of the working volume is spaced more than 10 cm from the main axis.

24. A method according to claim 10, further comprising the step of adjusting the axial positions along the main axis of the third and fourth magnets to generate a substantially uniform magnetic field suitable for an NMR experiment in the working volume.

25. A method according to claim 10, further comprising the step of adjusting the axial positions along the main axis of the third and fourth magnets to effect a working volume having a radial dimension of more than 10 cm.

26. A method according to claim 25, further comprising the step of adjusting the axial positions along the main axis of the third and fourth magnets to effect a working volume having a radial dimension of more than 20 cm.

27. A method according to claim 10, further comprising the step of adjusting the positions of the third and fourth magnets to effect a working volume having a radially inner side spaced more than 10 cm from the main axis.

28. An assembly which generates a magnetic field in a working volume spaced from the assembly, the assembly comprising:

first and second magnets, each having a north and a south pole and a respective magnet axis which joins the north and south poles, the first and second magnets being positioned so that the respective magnet axes are along a main axis of the assembly and a pole of the first magnet faces a like pole of the second magnet; and third and fourth magnets, each having a north and a south pole and a respective magnet axis which joins the north and south poles, the third and fourth magnets being positioned so that the respective magnet axes are substantially parallel with the main axis, wherein the position of at least one magnet of the group comprising the first, second, third and fourth magnets is adjustable in the direction of the main axis and the relative positions and magnetic field strengths of the first, second, third and fourth magnets are chosen to control the radial dimension and the characteristics of the magnetic field generated in the working volume.

29. A method according to claim 28, further comprising the step of adjusting the axial positions along the main axis of the third and fourth magnets to generate a substantially uniform magnetic field suitable for an NMR experiment in the working volume.

* * * * *